United States Patent

Shima et al.

[11] Patent Number: 5,925,484
[45] Date of Patent: Jul. 20, 1999

[54] BLACK PHOTOSENSITIVE RESIN COMPOSITION, COLOR FILTER MADE BY USING THE SAME, AND A PROCESS FOR THE PRODUCTION THEREOF

[75] Inventors: Yasuhiro Shima; Takao Taguchi; Akira Tamura, all of Tokyo; Hayato Ikeda; Nobuyuki Ando, both of Suita, all of Japan

[73] Assignees: Toppan Printing Co., Ltd., Tokyo; Nippon Shokubai Co., Ltd., Osaka, both of Japan

[21] Appl. No.: 09/043,572

[22] PCT Filed: Jul. 29, 1997

[86] PCT No.: PCT/JP97/02606

§ 371 Date: Apr. 1, 1998

§ 102(e) Date: Apr. 1, 1998

[87] PCT Pub. No.: WO98/05712

PCT Pub. Date: Feb. 12, 1998

[30] Foreign Application Priority Data

Aug. 2, 1996 [JP] Japan ................ 8-205044

[51] Int. Cl.[6] ................ G02B 5/20; G02F 1/1335; G03F 7/00
[52] U.S. Cl. ................ 430/7; 430/270.1
[58] Field of Search ................ 430/7, 270.1, 349/110

[56] References Cited

U.S. PATENT DOCUMENTS 5,055,379 10/1991 Bagchi et al. ................ 430/7
5,639,579 6/1997 Hayashi et al. ................ 430/7
5,782,968 7/1998 Hirayama et al. ................ 106/476
5,786,042 7/1998 Inoue et al. ................ 428/1

FOREIGN PATENT DOCUMENTS

| 4-177202 | 6/1992 | Japan . |
| 6-059119 | 3/1994 | Japan . |
| 6-067421 | 3/1994 | Japan . |
| 7-281440 | 10/1995 | Japan . |
| 9-166869 | 6/1997 | Japan . |

Primary Examiner—John A. McPherson
Attorney, Agent, or Firm—Armstrong, Westerman Hattori, McLeland & Naughton

[57] ABSTRACT

There is provided a black photoresist composition comprising a carbon black grafted with a polymer compound, a resin material, a crosslinking agent and a photo acid generator, in which specific amounts of the grafted carbon black, the resin material, the crosslinking agent and the photo acid generator are comprised. In addition, there is provided a color filter that has a black matrix made by using this black photoresist composition and is free of protuberances at the overlapping portions of multi-color picture elements and the black matrix. Thus, the present invention is able to provide a black photoresist composition, a color filter using the black photoresist composition, and a method for preparing the color filter that allows the formation of a black matrix having a high density that blocks out light and low reflectance, and the production of a color filter having a high degree of flatness and high film strength.

6 Claims, 1 Drawing Sheet

BLACK PHOTOSENSITIVE RESIN COMPOSITION, COLOR FILTER MADE BY USING THE SAME, AND A PROCESS FOR THE PRODUCTION THEREOF

SPECIFICATION

1. Technical Field

The present invention relates to a black photoresist composition, a color filter using the composition, and a method for preparing the color filter, and more particularly, to a material for preparing a color filter used in, for example, a liquid crystal display, and especially to a black photoresist composition used in forming a black matrix and a process for forming a black matrix.

2. Background Art

Color filters have come to be widely used in the prior art in the field of liquid crystal display apparatuses. These color filters normally consist of multi-colored picture elements, such as red, green and blue, arranged on a transparent substrate. Moreover, in order to obtain images having good contrast, a black matrix is formed between these picture elements. Moreover, this black matrix is also used for the purpose of preventing erroneous operation of the transistors used in TFT-driven liquid crystal displays.

There are many cases in which the above-mentioned black matrix is normally formed with a metal thin film composed of a fine pattern on a glass transparent substrate. A specific example of a method that is commonly employed comprises forming a thin film of a metal or metal compound such as chrome, nickel or aluminum and so forth using a vacuum deposition technique such as vapor deposition or sputtering, followed by forming a fine pattern by photolithography.

More specifically, a resist pattern is formed by coating a photoresist on a thin film of metal and so forth, drying the photoresist and irradiating with ultraviolet rays through a photomask to develop. Following this, a black matrix is formed after going through an etching step and resist removing step. However, the black matrix prepared in the above-mentioned process has an extremely high production cost due to the complexity of the process, while also having the disadvantage of the cost of the color filter in which it is used also being high.

In the case of installing a color filter using this metal thin film on a transmission-type liquid crystal display, the surface of the metal typically used for the metal thin film has high reflectance and the color filter is illuminated with intense external light, such as in the case of a chrome thin film, the reflected light becomes intense thus resulting in the problem of a remarkable decrease in display quality.

On the other hand, various methods have been examined for resolving the problems associated with a black matrix using metal thin film as described above. For example, a method for forming a black matrix has been proposed in which carbon black, and, as necessary, organic pigment are dispersed in a photoresist composition followed by using this to form the black matrix. However, a film thickness of approximately 1 μm is required to obtain shield with carbon black. Consequently, the portions at which the black matrix overlaps with the multi-colored picture elements, which serve as the positioning margins, become protuberances that cause unevenness in the display.

Japanese Unexamined Patent Publication No. 6-59119 proposes a method and material for selectively providing a black matrix only between the gaps in the multi-colored picture elements by providing a black photoresist layer on and between the multi-colored picture elements, and then exposing the entire surface through a transparent substrate using the multi-colored picture elements as a mask.

The above-mentioned protuberances are not formed when this type of so-called back exposure method is used. However, in order to obtain adequate thickness of the black matrix while also not leaving any black layer on the multi-colored picture elements, the shield of the black photoresist composition of the multi-colored picture elements must be sufficiently high at the wavelength of the light used for exposure. In order to achieve this, an ultraviolet absorber such as titanium oxide, zinc oxide, benzotriazole compound or coumarin compound and so forth had to be added to the multi-colored picture elements serving as the mask.

Consequently, this resulted in the problem of the optical characteristics, namely the transparency and contrast ratio, of the multi-color picture elements as a color filter being remarkably impaired.

On the other hand, in a photopolymer type of photoresist, since the photosensitivity characteristics curve (a curve representing a characteristic of a photoresist by showing the relationship between an exposure amount to the photoresist as an abscissa and the remaining amount of the photoresist after development as an ordinate) is relatively gentle-sloping and the γ value (a value representing a gradient of the straight portion of the photosensitivity characteristics curve) is small, a sufficiently large amount of exposure light was necessary to obtain adequate film thickness, and this, in turn, required the opacity of the multi-color picture elements to be sufficiently high.

Moreover, since carbon black has the property of capturing radicals that are generated from the photopolymerization initiator used in photopolymer-types of photoresists when irradiated with ultraviolet rays, it inhibits photopolymerization, thus making it difficult to adequately form picture elements at an economical exposure level and resulting in the problem of, for example, separation of the pattern during development.

In addition, Japanese Unexamined Patent Publication No. 4-177202 proposes a material for a black matrix comprising an photo acid generator, crosslinking agent, binder polymer having a crosslinking site and black pigment. There is no description in the specification of this patent, however, relating to a back exposure method in which exposure is performed through a transparent substrate. In addition, in the case of simply applying a non-grafted black pigment to the back exposure method, it would be possible to obtain film strength, dispersion stability and storage stability for an optical density (O.D.) of 2.0 or less at a formed film thickness of 1 μm. However, in the case of trying to obtain an optical density of greater than 2.0 for a formed film thickness of 1 μm, problems would be encountered in which the film strength is extremely weak due to small amount of resin components near the surface of the formed black matrix, as well as insufficient adhesion by heating. In addition, there would also be the disadvantage of low sensitivity which would prevent the obtaining of dispersion stability and storage stability of the resist itself.

In order to solve these problems, the object of the present invention is to provide a black photoresist composition that has sufficient optical density for shielding light, allows the formation of a black matrix having low reflectance and high sensitivity, and is able to prepare a color filter having high flatness and high film strength, as well as a color filter using the same and a method for preparing the color filter.

DISCLOSURE OF THE INVENTION

As a result of earnest research in order to solve the above-mentioned problems, the inventors of the present invention found that said problems could be solved by using a specific black photoresist composition in the formation of a black matrix, thereby leading to completion of the present invention.

The present invention is a black photoresist composition comprising a carbon black grafted with a polymer compound, a resin material, a crosslinking agent and a photo acid generator, wherein the amount of the grafted carbon black is 35~93.6 parts by weight, the amount of the resin material is 1~35 parts by weight, the amount of the crosslinking agent is 0.4~15 parts by weight, and the amount of the photo acid generator is 5~15 parts by weight when the amount of the black photoresist composition is taken to be 100 parts by weight.

In addition, the present invention is characterized in that, in the above-mentioned black photoresist composition, the above-mentioned polymer compound has in its molecule one or more types of the groups selected from the groups consisting of aziridine, oxazoline, N-hydroxyalkylamide, epoxy, thioepoxy, isocyanate, vinyl, acryl, methacryl, silicon-based hydrolyzing and amino groups.

Alternatively, the present invention is a black photoresist composition characterized in that, in the above-mentioned black photoresist composition, the pH of the above-mentioned carbon black is 7 or less, and the ratio of said polymer compound to the carbon black is 5~100 parts by weight when the amount of the carbon black is taken to be 100 parts by weight.

Moreover, the present invention is characterized in that, in the above-mentioned black photoresist composition, the above-mentioned resin material is a polymer that comprises an OH group that can serve as a crosslinking site, and is soluble in an alkaline aqueous solution.

In addition, the present invention is a color filter that comprises a black matrix comprising any of the above-mentioned black photoresist compositions, and multi-color picture elements, and is free of protuberances at the overlapping portions of the black matrix and the multi-color picture elements.

Moreover, the present invention is a method for preparing the above-mentioned color filter comprising at least the following steps (1) through (5):

(1) a step of providing multi-color picture elements on transparent substrate;

(2) a step of providing the above-mentioned black photoresist composition between and on the multi-color picture elements formed on the transparent substrate;

(3) a step of performing exposure from the back of the transparent substrate;

(4) a step of heating the transparent substrate after said exposure; and (5) a step of removing the unexposed portion of the black photoresist composition from the transparent substrate by dissolving after said heating.

BEST MODE FOR CARRYING OUT THE INVENTION

Figure 1:
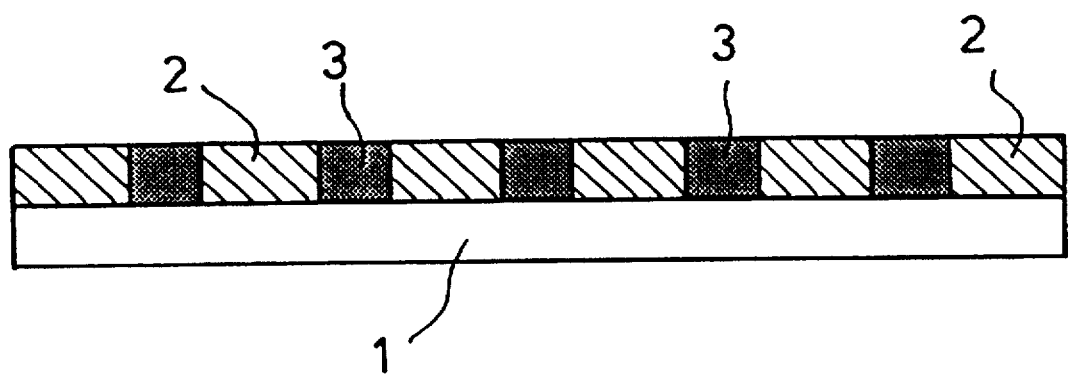
FIG. 1 is an explanatory drawing showing the structure of a cross-section of an embodiment of the color filter in the present invention.

The following provides an explanation of an embodiment of the present invention.

In the present invention, a black photoresist composition comprising a resin material, a crosslinking agent, a photo acid generator and a polymer-grafted carbon black is used as a black photoresist composition that serves as a black matrix.

A polymer compound comprising an OH group that is able to serve as a crosslinking site and is soluble in an alkaline aqueous solution is preferably used for the resin material used in the present invention. Examples of the resin materials that are used include phenols typically represented by phenol novolak and p-hydroxystyrene, and homopolymers or copolymers of monomers comprising OH groups such as 2-hydroxyethylmethacrylate, 2-hydroxyethylacrylate, acrylic acid, methacrylic acid, maleic acid and fumaric acid.

Other examples of monomers that can be used in copolymerization include styrene, phenylmaleimide, methylacrylate, ethylacrylate, butylacrylate, benzylacrylate, methylmethacrylate, ethylmethacrylate, butylmethacrylate and benzylmethacrylate.

These resin materials are used within a range of 1 to 35 parts by weight per 100 parts by weight of black photoresist composition. If the amount used is less than 1 part by weight, problems occur including deterioration of photosensitivity, deterioration of pattern formation due to carbon aggregation, and insufficient film strength and adhesion. If the amount used exceeds 35 parts by weight, shield becomes insufficient.

Examples of the crosslinking agents that can be used in the present invention include methylolurea, urea resin, methylolmelamine, butylolmelamine, methylolguanamine or alkyl ethers of these compounds. Use of alkyl ether compounds is preferable in consideration of their excellent thermal stability. Alkyl groups having 1–5 carbon atoms are preferable for the alkyl groups of these alkyl ethers.

The alkyl ether compound of hexamethylolmelamine is particularly preferable as an alkyl ether compound due to its excellent sensitivity. In addition, compounds having two or more epoxy groups can also be used.

These crosslinking agents are used within the range of 0.4 to 15 parts by weight per 100 parts by weight of black photoresist composition. If the amount used is less than 0.4 parts by weight, photosensitivity properties are impaired, while if the amount used exceeds 15 parts by weight, shield becomes insufficient.

The photo acid generators that can be used in the present invention consist of triazine derivatives comprising trihalomethyl groups or onium salts that absorb at a wavelength comprised in light emitted by a light source, and generate acid as a result of absorbing light.

Examples of triazine derivatives comprising trihalomethyl groups include
2,4,6-tris(trichloromethyl)-s-triazine,
2-(p-methoxystyryl)-4,6-bis(trichloromethyl)-s-triazine,
2-phenyl-4,6-bis(trichloromethyl)-s-triazine,
2-(p-methoxyphenyl)-4,6-bis(trichloromethyl)-s-triazine,
2-(p-chloro-phenyl)-4,6-bis(trichloromethyl)-s-triazine,
2-(4'-methoxy-1'-naphthyl)-4,6-bis(trichloromethyl)-s-triazine, and 2-(p-methylthiophenyl)4,6-bis(trichloromethyl)-s-triazine.

In addition, examples of onium salts include diarylic iodinium salts such as diphenyliodiniumtetrafluoroborate, diphenyliodiniumhexafluorophosphonate, diphenyliodiniumhexafluoroarsenate, diphenyliodiniumtrifluoromethanesulfonate, diphenyliodiniumtrifluoroacetate, diphenyliodinium-p-toluenesulfonate, 4-methoxyphenylphenyliodiniumtetrafluoroborate, 4-methoxyphenylphenyliodiniumhexafluoro-phosphonate, 4-methoxyphenylphenyliodiniumhexafluoro-arsenate, 4-methoxyphenylphenyliodiniumtrifluoromethanesulfonate, 4-methoxyphenylphenyliodiniumtrifluoroacetate, 4-methoxyphenyliodinium-p-toluenesulfonate, bis(4-tert-butylphenyl)iodiniumtetrafluoroborate, bis(4-tert-butylphenyl)iodiniumhexafluorophosphonate, bis(4-tert-butylphenyl)iodiniumhexafluoroarsenate, bis(4-tert-butylphenyl)iodiniumtrifluoromethanesulfonate, bis(4-tert-butylphenyl)iodiniumtrifluoroacetate and bis(4-tert-butylphenyl)iodinium-p-toluenesulfonate; and, triarylic sulfonium salts such as triphenylsulfoniumtetrafluoroborate, triphenylsulfoniumhexafluorophosphonate, triphenylsulfoniumhexafluoroarsenate, triphenylsulfoniumtrifluoromethanesulfonate, triphenylsulfoniumtrifluoroacetate, triphenylsulfoniump-toluenesulfonate, 4-methoxyphenyldiphenylsulfoniumtetrafluoroborate, 4-methoxyphenyldiphenylsulfoniumhexafluorophosphonate, 4-methoxyphenyldiphenylsulfoniumhexafluoro-arsenate, 4-methoxyphenyldiphenylsulfoniumtrifluoromethanesulfonate, 4-methoxyphenyldiphenylsulfoniumtrifluoroacetate, 4-methoxyphenyldiphenylsulfonium-p-toluenesulfonate, 4-phenylthiophenyldiphenyltetrafluoroborate, 4-phenylthiophenyldiphenylhexafluorophosphonate, 4-phenylthiophenyldiphenylhexafluoroarsenate, 4-phenylthiophenyldiphenyltrifluoromethanesulfonate, 4-phenylthiophenyldiphenyltrifluoroacetate and 4-phenylthiophenyldiphenyl-p-toluenesulfonate.

These photo acid generators may be used alone or in combination. For example, the combination of a light absorber and acid generator can be used. The amount thereof used is within the range of 5 to 15 parts by weight per 100 parts by weight of the black photoresist composition. If the amount added exceeds 15 parts by weight, the amount of acid generated becomes excessively large. This causes acid to be dispersed to unexposed portions due to heating after pattern exposure that in turn causes a crosslinking reaction resulting in decreased resolution. In addition, if the added amount is less than 5 parts by weight, the amount of acid generated is deficient. This causes the crosslinking reaction to not proceed sufficiently thereby preventing pattern formation.

Example of techniques for grafting a polymer compound to carbon black are described from pages 167 to 173 of the Handbook of Carbon Black (3rd Edition) (edited and published by the Society of Carbon Black). More specifically, these methods consist of (1) a method in which vinyl monomer is polymerized in the presence of carbon black causing the grown polymer chain to be attached to the surface of the carbon black particles; (2) a method in which a graft chain is grown from a polymerization initiator group introduced onto the surface of the carbon black; and (3) a method in which functional groups on the surface of the carbon black are reacted with reactive polymer. Any of these techniques may be used in the invention of the present application.

From the viewpoint of grafting efficiency, it is preferable to use the technique of (3), and moreover, it is most preferable to use a reactive polymer or polymer compound having an aziridine, oxazoline, N-hydroxyalkylamide, epoxy, thioepoxy, isocyanate, vinyl, acryl, methacryl, silicon-based hydrolyzing or amino group referred to in the present invention. It is necessary that one or more of these groups be present in the polymer compound.

A polymer compound having one or more types of groups selected from an aziridine, oxazoline, N-hydroxyalkylamide, epoxy, thioepoxy or isocyanate group is particularly preferable in terms of reactivity with the functional groups on the surface of the carbon black. Moreover, a polymer compound having one or more types of groups selected from an aziridine, oxazoline or N-hydroxyalkylamide group is more preferable.

In the case of reacting carbon black and the polymer compound, polymer components other than said polymer compound, monomers, organic solvents and other substances may be present in the reaction system provided they do not impair the reaction. It is necessary that the polymer compound be comprised at 5~100 parts by weight, and preferably 20~60 parts by weight, relative to the amount of carbon black. If the amount of the polymer compound is less than 5 parts by weight, there is no effect of grafting, namely no improvement in film strength, while if the amount of the polymer compound exceeds 100 parts by weight, it inhibits photosensitivity resulting in insufficient optical density.

Although there is no particular limitation on the carbon black used in the present invention provided it is able to demonstrate the effects of the present invention, preferably, in the case of suitably selecting according to the techniques described above for grafting a polymer compound to carbon black and using the reactive polymer of the present invention, it has functional groups such as a carboxyl group or hydroxyl group on its surface. For example, furnace black, channel black, acetylene black or lamp black can be used. Although ordinary commercial products can also be used, the product should have a pH of 7 or less, and preferably 5 or less, as carbon black. If the pH exceeds 7, the effect of grafting, namely improved thin film strength, is not observed. It is preferable that the mean particle size of the carbon black be within the range of 0.0005 to 0.5 μm, and particularly 0.001 to 0.2 μm. Carbon black having a mean particle size of less than 0.0005 μm can not be easily obtained, and in the case the mean particle size exceeds 0.5 μm, there is the risk of not providing adequate dispersion to the resulting carbon black-grafted polymer.

This grafted carbon black is used within the range of 35 to 93.6 parts by weight per 100 parts by weight of the black photoresist composition. If the amount used is less than 35 parts by weight, it is not possible to obtain adequate opacity. If the amount used exceeds 93.6 parts by weight, it impairs photosensitivity characteristics.

Furthermore, the pH of the carbon black is measured in compliance with JIS-K6221 (Carbon Black Test Methods for Rubber).

These materials are mixed using a dispersing machine such as a two-roll mill, three-roll mill, sand mill or paint conditioner to prepare the black photoresist composition.

Moreover, organic solvents such as ethylcellosolve, ethylcellosolveacetate, butylcellosolve, butylcellosolveacetate, ethylcarbitol, ethylcarbitolacetate, diethyleneglycol, cyclohexanone, propyleneglycol monomethylether, propyleneglycol monomethyl etheracetate and lactate esters may be used as diluting solvents to improve the ease of the mixing procedure during dispersion.

The following provides an explanation of one example of the steps of the color filter preparing method of the present invention based on the drawings.

Figure 2:
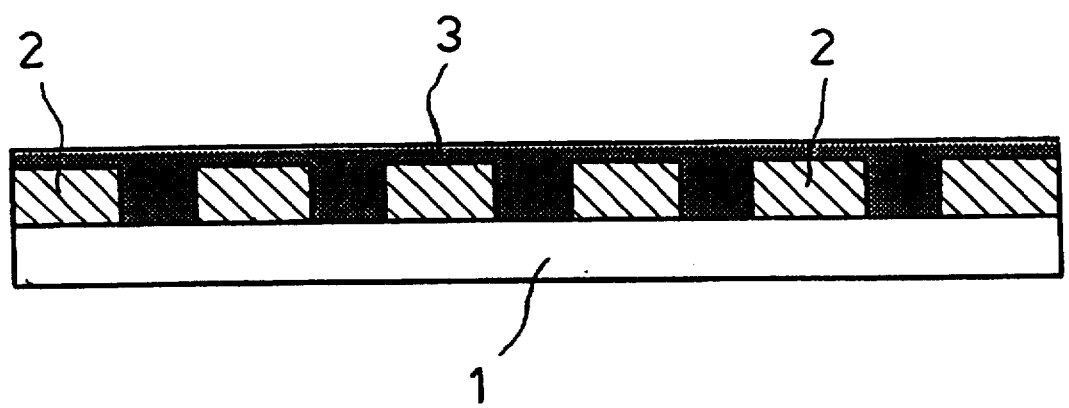
FIG. 2 is an explanatory drawing showing the structure of a cross-section of a color filter at an intermediate step in an embodiment of the color filter preparing method in the present invention.

Multi-color picture elements 2 are provided on transparent substrate 1, and black photoresist composition 3 of the present invention is uniformly coated on and between these multi-color picture elements 2 by spin coating, bar coating, roll coating or curtain coating and so forth as shown in FIG. 2 to form a black resin layer.

Any method currently used practically, including dyeing, pigment dispersion, printing, electrodeposition or other method of the prior art, may be used to form the multi-color picture elements. In addition, heat at a temperature of 70~100° C. may be applied in the case of adhering the black resin layer and transparent substrate.

Next, the resulting black resin layer is exposed by irradiating with ultraviolet light of 400 nm or less, and preferably ultraviolet light within a range of 250~400 nm, through the back of the transparent substrate to generate acid in only the portion of the black resin layer in the gaps between the multi-color picture elements. Examples of light sources that can be used for exposure include high-pressure mercury lamps and ultra-high-pressure mercury lamps. In the case the photosensitive wavelength region of the black photoresist composition extends beyond 400 nm, it is preferable to expose through a visible light cutoff filter.

Next, a crosslinking reaction is carried out at only the portions of the black photoresist layer in the gaps between the multi-color picture elements by using an acid-catalyzed reaction for 15 seconds to 5 minutes at a heating temperature of 90~150° C.

Next, the non-crosslinked portions of the black resin on the multi-color picture elements are removed using a developing solution to obtain a color filter having a high degree of flatness as shown in FIG. 1. Inorganic alkaline solutions such as sodium hydroxide, potassium hydroxide, sodium carbonate or potassium carbonate, alkylamines such as triethylamine, alcoholamines such as triethanolamine, and quaternary amines such as tetramethylammonium hydroxide can be used for the developing solution.

In the present invention as described above, a black photoresist composition having high sensitivity can be obtained by using a resin material, crosslinking agent and photo acid generator. In addition, the use of a grafted carbon black material achieves the effect whereby the occurrence of separation caused by aggregation and destruction following elution of the polymer during development is prevented. In addition, the use of a crosslinked photoresist composition results in a greater slope of the sensitivity characteristics curve by taking advantage of the acid generated by the photo acid generator, thereby causing a sudden increase in the residual film rate following development at regions exposed above a certain light level. Consequently, the effect is achieved whereby there is less photoresist composition remaining on the multi-color picture elements, and a film of a prescribed thickness can be obtained on the transparent substrate.

In addition, by forming a black matrix using the back exposure method, the effect is achieved whereby there is no overlapping of the multi-color picture elements and black matrix. As a result of all of these effects, there is no need to cure a black photoresist layer through to the inside with high intensity ultraviolet light as in the method of exposing from the back of a transparent substrate in the prior art. Moreover, as a result of exposing from the back of a transparent substrate using low intensity ultraviolet light, a color filter can be formed that is free of overlapping of the multi-color picture elements and black matrix, regardless of the absorption in the ultraviolet region of the multi-color picture elements or the optical density of the black photoresist layer.

[Embodiments]

Although the following provides a detailed explanation of the present invention through its embodiments, the present invention is not limited by these embodiments.

[Synthesis Example of a Grafted Carbon Black (GCB) Polymer Dispersion Comprising Carboxyl Groups]

(Step 1)

Solvent consisting of 80 parts toluene and 20 parts methylethylketone was charged into a separable flask equipped with a stirring bar, inert gas feed tube, reflux condenser, thermometer and dropping funnel, after which a mixed solution consisting of 85 parts methylmethacrylate (MMA), 15 parts 2-hydroxyethylmethacrylate (HEMA), 4.3 parts thioglycolic acid and 2 parts azo-bis-isobutyronitrile (AIBN) were dropped in continuously over the course of 4 hours to perform polymerization.

Next, after heating for 3 hours at the same temperature, aging was performed for 2 hours at 95° C. to complete polymerization. 8.5 parts of glycidylmethacrylate (GMA) (1.3 times eq/COOH), 1.3 parts of tetrabutylammonium bromide as catalyst, and 0.04 parts hydroquinone monomethylether as polymerization inhibitor were added to 200 parts of this reaction solution and reacted for 10 hours at a reaction temperature of 85~90° C. After reprecipitating in n-hexane, the reaction solution was dried under reduced pressure for 2 days at 50° C. to obtain MMA-HEMA copolymer macromonomer with methacrylate on one terminal.

(Step 2)

50 parts of the macromonomer obtained in step 1, 25 parts styrene (St), 20 parts HEMA, 5 parts isopropenyloxazoline (IPO) and 3 parts AIBN as initiator were dissolved in 100 parts of propyleneglycol monomethyl etheracetate (PGM-Ac) as solvent to obtain a polymerizing monomer composition.

50 parts of PGM-Ac were charged into a separable flask similar to that used in step 1 followed by heating to 80° C. After dropping the above-mentioned polymerizing monomer composition charged in a dropping funnel over the course of 3 hours while maintaining the temperature at 80° C., the polymerization reaction was continued for 2 hours at the same temperature. Next, the aging reaction was carried out for 2 hours by raising the temperature to 110° C. to obtain a solution of a polymer compound having oxazoline groups as its reactive groups (non-volatile components: 40%).

(Step 3)

30 parts carbon black, 22.5 parts of the polymer compound solution obtained in step 2, 97.5 parts PGM-Ac, and 800 parts zirconia beads were charged into a separable flask equipped with a stirring bar, condenser and temperature sensor. This was allowed to react for 3 hours at 100° C. while stirring at 600 rpm. After allowing to cool, the beads were separated to obtain a grafted carbon black (GCB) polymer dispersion having a carbon black content of 20%.

(Step 4)

3.59 parts anhydrous trimellitic acid (MW 192.13) and 0.09 parts 1,8-diazabicyclo[5,4,0]-undecene (DBU) as a catalyst were added to 150 parts of the GCB dispersion obtained in step 3 and reacted for 1 hour at a temperature of 80° C. to obtain a GCB dispersion comprising carboxyl groups.

[Formation of Multi-color Picture Elements]

RGB colored patterns were formed on a transparent glass substrate manufactured by Corning Corp., as its tradename of "7059" in accordance with routine methods using a resist manufactured by Fujihanto Corp., as its tradename of "Color Mosaic CRY7000, CGY7000, CBV7000" on top of the transparent substrate. The film thickness of these multi-color picture elements was 1.5 μm.

[Formation of Black Photoresist Layer]

300 parts of the GCB dispersion obtained in step 4, 12 parts polyhydroxystryene (MW 5000) for the resin material, 5 parts crosslinking agent manufactured by Sanwa Chemical Corp., as its tradename of "Nikkalack MW-30M", 5 parts photo acid generator manufactured by Midori Chemical Corp., as its tradename of "TAZ-104", 172 parts PGM-Ac as solvent, and 500 g of glass beads were placed in a glass bottle followed by dispersing for 2 hours with a paint shaker to prepare a black photoresist dispersed liquid. This black photoresist dispersed liquid was then coated for 5 seconds at 760 rpm using a spinner on the RGB colored patterns obtained during formation of the multi-color picture elements followed by drying to form the black photosensitive layer as shown in FIG. 2.

[Exposure]

The entire surface was exposed through the transparent substrate with the above-mentioned multi-color picture elements serving as a mask while using a 3 kW ultra-high-pressure mercury lamp at an exposure level of 160 mJ/cm$^2$.

[Heating]

Next, the entire structure was heated for 1 minute at 90° C. using a hot plate.

[Development]

Development was performed for 30 seconds by using 1.25% aqueous sodium hydroxide solution for the developing solution, and spraying the developing solution in the form of a shower while rotating the transparent substrate to remove the unexposed portions on the RGB colored pattern of the black photoresist layer. Finally, the structure was heated for 1 hour in an oven at 230° C. to obtain a color filter.

INDUSTRIAL APPLICABILITY

As has been described above, since the black photoresist composition used for a black matrix in the present invention itself is a highly sensitive resist, a black matrix can be formed at a practical level of exposure.

Due to the high γ value of the black photoresist composition, a sufficiently remaining film thickness is obtained at a level of exposure at which fogging does not occur on the multi-color picture elements. There is also no need to add an ultraviolet absorber or fluorescent whitener and so forth to the red, green and blue multi-color picture elements used as the mask at that time. Consequently, a sufficiently high degree of crosslinking is exhibited even when exposed from the back of the transparent substrate, the spaces between each multi-color picture element are filled in, and there is no formation of protuberances due to overlapping of each multi-color picture element and black matrix as in the prior art. Moreover, there is no need to add additives into the multi-color picture elements, and this results in the effect of the multi-color picture elements being clear. In addition, since a polymer compound is chemically bonded to carbon black, there is no flow out of resin alone with developing solution and so forth, thereby resulting in the film strength of the black matrix being extremely high.

We claim:

1. A black photoresist composition comprising a carbon black grafted with a polymer compound in an amount of 20–60 parts by weight of polymer compound for 100 parts by weight of carbon black, a resin material, a crosslinking agent and a photo acid generator, wherein the amount of the grafted carbon black is 35–93.6 parts by weight, the amount of the resin material is 1–35 parts by weight, the amount of the crosslinking agent is 0.4–15 parts by weight, and the amount of the photo acid generator is 5–15 parts by weight for 100 parts by weight of the black photoresist composition.

2. A black photoresist composition as set forth in claim 1 wherein said polymer compound has in its molecule one or more types of the groups selected from the groups consisting of aziridine, oxazoline, N-hydroxyalkylamide, epoxy, thioepoxy, isocyanate, vinyl, acryl, methacryl, silicon-based hydrolyzing and amino groups.

3. A black photoresist composition as set forth in claim 1 wherein the pH of the said carbon black is 7 or less.

4. A black photoresist composition as set forth in claim 1 wherein said resin material is a polymer that comprises an OH group that can serve as a crosslinking site, and is soluble in an alkaline aqueous solution.

5. A color filter which comprises a black matrix comprising a black photoresist composition as set forth in any of claims 1 through 4, and multicolor picture elements, and is free of protuberances at the overlapping portions of the black matrix and multi-color picture elements.

6. A method for providing a color filter comprising a black matrix and multi-color picture elements, wherein said black matrix comprises a black photoresist composition as set forth in any of claims 1 through 4, comprising at least the following steps (1) through (5):

(1) a step of providing said multi-color picture elements on a transparent substrate;

(2) a step of providing said black photoresist composition between and on the multi-color picture elements formed on the transparent substrate;

(3) a step of performing exposure of the black photoresist composition from the back of the transparent substrate;

(4) a step of heating the transparent substrate after said exposure; and (5) a step of removing the unexposed portion of the black photoresist composition from the transparent substrate by dissolving the unexposed portion after said heating.

* * * * *